US012200944B2

(12) United States Patent
Syed Mohammed et al.

(10) Patent No.: US 12,200,944 B2
(45) Date of Patent: Jan. 14, 2025

(54) MAGNETIC SHIELDING OF SEMICONDUCTOR DEVICES

(71) Applicant: GLOBALFOUNDRIES Singapore Pte. Ltd., Singapore (SG)

(72) Inventors: Zishan Ali Syed Mohammed, Singapore (SG); Vinayak Bharat Naik, Singapore (SG)

(73) Assignee: GLOBAL FOUNDRIES Singapore Pte. Ltd., Singapore (SG)

( * ) Notice: Subject to any disclaimer, the term of this patent is extended or adjusted under 35 U.S.C. 154(b) by 534 days.

(21) Appl. No.: 17/498,742

(22) Filed: Oct. 11, 2021

(65) Prior Publication Data

US 2023/0112673 A1    Apr. 13, 2023

(51) Int. Cl.
*H10B 61/00* (2023.01)
*H10N 50/80* (2023.01)

(52) U.S. Cl.
CPC .............. *H10B 61/00* (2023.02); *H10N 50/80* (2023.02)

(58) Field of Classification Search
CPC ................................ H10B 61/00; H10N 50/80
See application file for complete search history.

(56) References Cited

U.S. PATENT DOCUMENTS

| | | | |
|---|---|---|---|
| 6,962,833 B2 | 11/2005 | Tuttle et al. | |
| 6,984,867 B2 | 1/2006 | Nakajima | |
| 9,070,692 B2 | 6/2015 | Zhou et al. | |
| 9,318,403 B2 | 4/2016 | Kim et al. | |
| 10,096,768 B2 | 10/2018 | Jiang et al. | |
| 10,453,801 B2 | 10/2019 | Seo et al. | |
| 10,475,985 B2 | 11/2019 | Bhushan et al. | |
| 10,686,008 B2 | 6/2020 | Gao et al. | |
| 2005/0230788 A1* | 10/2005 | Kato | G11C 11/16 257/659 |
| 2017/0025601 A1 | 1/2017 | Bhushan et al. | |
| 2020/0411449 A1* | 12/2020 | Chuang | H10N 50/80 |

* cited by examiner

*Primary Examiner* — Shih Tsun A Chou
(74) *Attorney, Agent, or Firm* — David Cain

(57) ABSTRACT

An assembly is provided. The assembly includes a packaged semiconductor device and an outer enclosure enclosing the packaged semiconductor device. The packaged semiconductor device includes at least four opposing sides. The outer enclosure includes a magnetic material and a non-magnetic region arranged adjacent to the at least four opposing sides of the packaged semiconductor device.

14 Claims, 4 Drawing Sheets

MAGNETIC SHIELDING OF SEMICONDUCTOR DEVICES

TECHNICAL FIELD

The present disclosure relates generally to semiconductor devices, and more particularly to magnetic shielding of semiconductor devices.

BACKGROUND

Semiconductor non-volatile memory devices may utilize a charge retention mechanism to store data. For example, a flash memory chip or an electrically erasable and programmable read-only memory (EEPROM) chip may store charges in a floating gate. In another example, a magneto-resistive random-access memory (MRAM) chip may store data in the magnetization of a magnetic material.

As the MRAM chip uses a magnetic material for data retention, the performance of the MRAM chip may be susceptible to undesirable interferences from an external magnetic field, such as from sources of magnetic flux including, but are not limited to, power lines, bar magnets, or the earth. Such magnetic interferences may adversely affect the reliability of the MRAM chip.

Therefore, solutions to overcome, or at least ameliorate, the disadvantage described above are desired.

SUMMARY

To achieve the foregoing and other aspects of the present disclosure, various embodiments of outer enclosures for magnetic shielding of semiconductor devices are presented.

According to an aspect of the present disclosure, an assembly is provided. The assembly includes a packaged semiconductor device including a semiconductor chip and an outer enclosure enclosing the packaged semiconductor device. The packaged semiconductor device includes at least four opposing sides. The outer enclosure includes a magnetic material and a non-magnetic region arranged adjacent to the at least four opposing sides of the packaged semiconductor device.

According to another aspect of the present disclosure, an assembly is provided. The assembly includes a packaged semiconductor device including a semiconductor chip and an outer enclosure including a magnetic material enclosing the packaged semiconductor device. The outer enclosure includes a side section having a horizontal non-magnetic region and a vertical non-magnetic region arranged therewithin.

According to yet another aspect of the present disclosure, an assembly is provided. The assembly includes a packaged semiconductor device including a semiconductor chip and an outer enclosure enclosing the packaged semiconductor device. The packaged semiconductor device includes at least four opposing sides. The outer enclosure includes a magnetic material and further includes a lower section embedding the packaged semiconductor device, an upper section over the lower section, and a non-magnetic region arranged between the upper section and the lower section, and the non-magnetic region is arranged adjacent to the at least four opposing sides of the packaged semiconductor device.

BRIEF DESCRIPTION OF THE DRAWINGS

The embodiments of the present disclosure will be better understood from a reading of the following detailed description, taken in conjunction with the accompanying drawings.

Figure 1A:
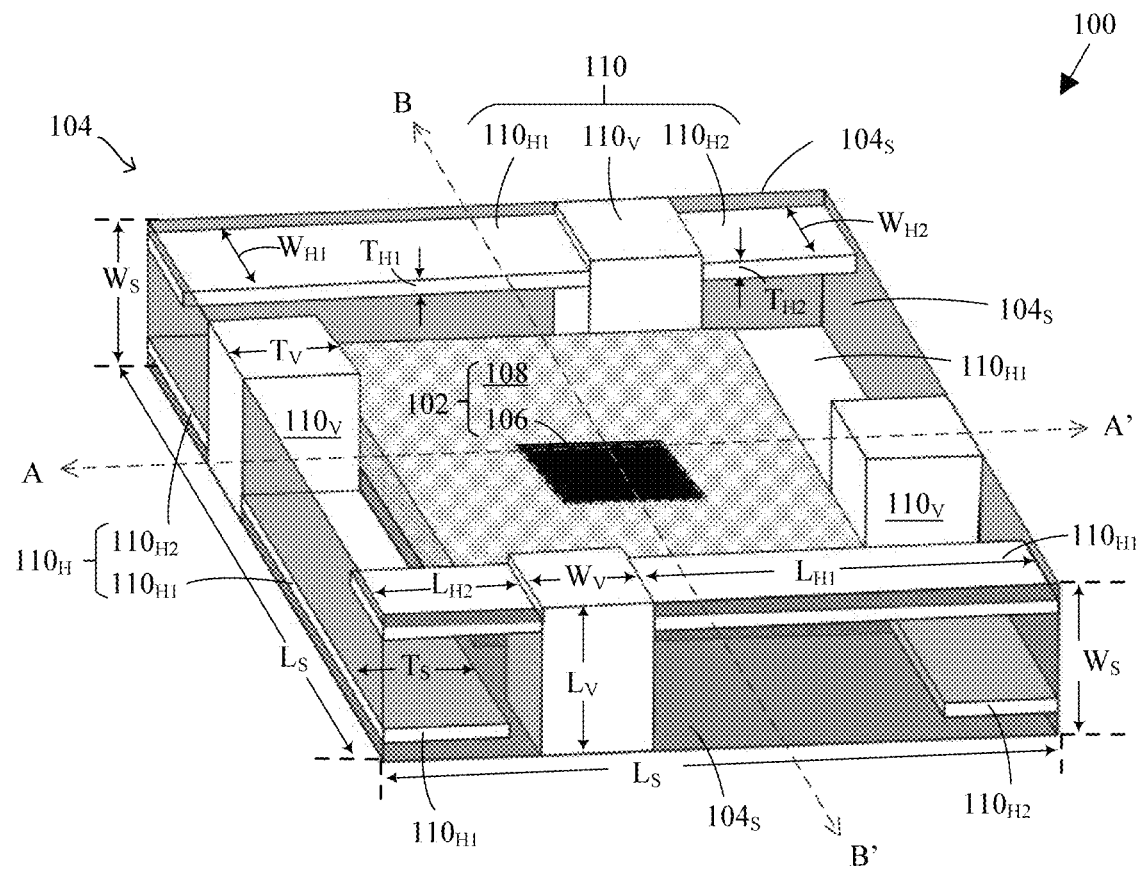
FIG. 1A is a perspective view of an assembled semiconductor device, according to an embodiment of the disclosure.

For simplicity and clarity of illustration, the drawings illustrate the general manner of construction, and certain descriptions and details of features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates generally to semiconductor devices, and more particularly to magnetic shielding of semiconductor devices.

A semiconductor chip that has completed fabrication may be assembled within a package to form a packaged semiconductor device. The semiconductor chip may include, but is not limited to, memory chips, microprocessors, standard chips, or systems-on-a-chip (SoCs), suitable for various semiconductor applications, such as low or high-frequency applications, as well as low, medium, or high power applications.

The package may function as a supporting structure for the semiconductor chip and may provide a means for electrically coupling the semiconductor chip to a printed circuit board and/or other semiconductor chips. The package may further serve to dissipate heat and protect the semiconductor chip against external contamination and/or environmental effects, such as moisture and/or particles.

A semiconductor chip that utilizes the orientation of a magnetization vector for device operation may require additional protection and an outer enclosure may be provided over the package. The outer enclosure may decrease the effects of magnetic field interference by magnetically shielding the semiconductor chip. External magnetic field interferences may come from sources of magnetic flux including, but are not limited to, power lines, bar magnets, the earth, or intentional introduction of magnetic field proximate to the semiconductor chip to affect the reliability of the semiconductor chip.

Various embodiments of the present disclosure are now described in detail with accompanying drawings. It is noted that like and corresponding elements are referred to by the use of the same reference numerals. It is further noted that specific elements may be denoted by a reference numeral and a subscript, for example, $104_S$, $110_H$, etc. When those elements are referred to generically, merely the reference numerals are used, for example, 104, 110, etc. The embodiments disclosed herein are exemplary, and not intended to be exhaustive or limiting to the disclosure.

An element may be defined by three dimensions, i.e., length, width, and thickness. As used herein, the "length" of an element refers to the longest of the three dimensions, and the "thickness" refers to the shortest dimension of the element.

Figure 1B:
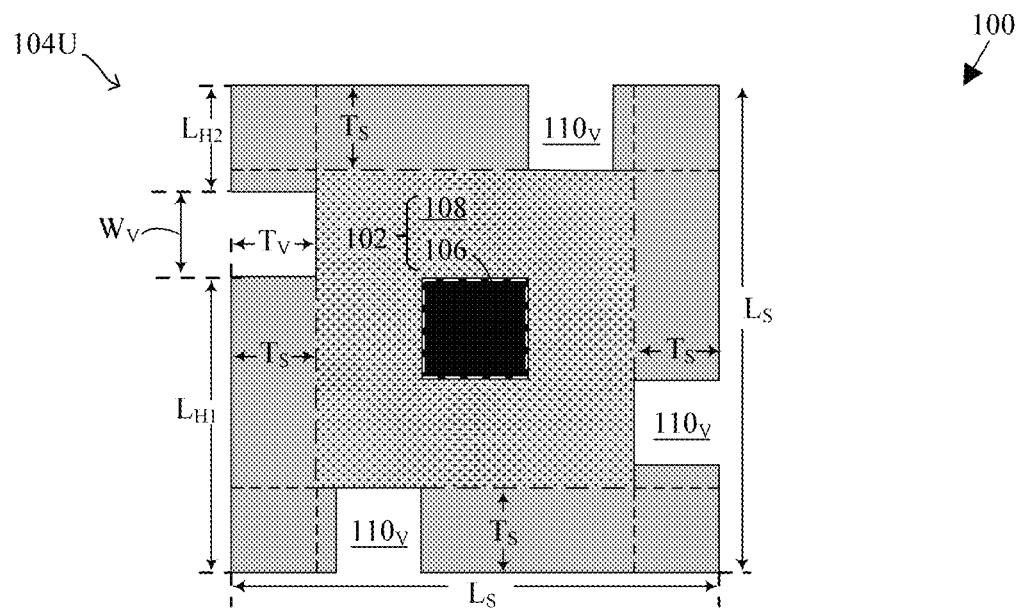
FIG. 1B is a top view of the assembled semiconductor device in FIG. 1A, according to an embodiment of the disclosure.
Figure 1C:
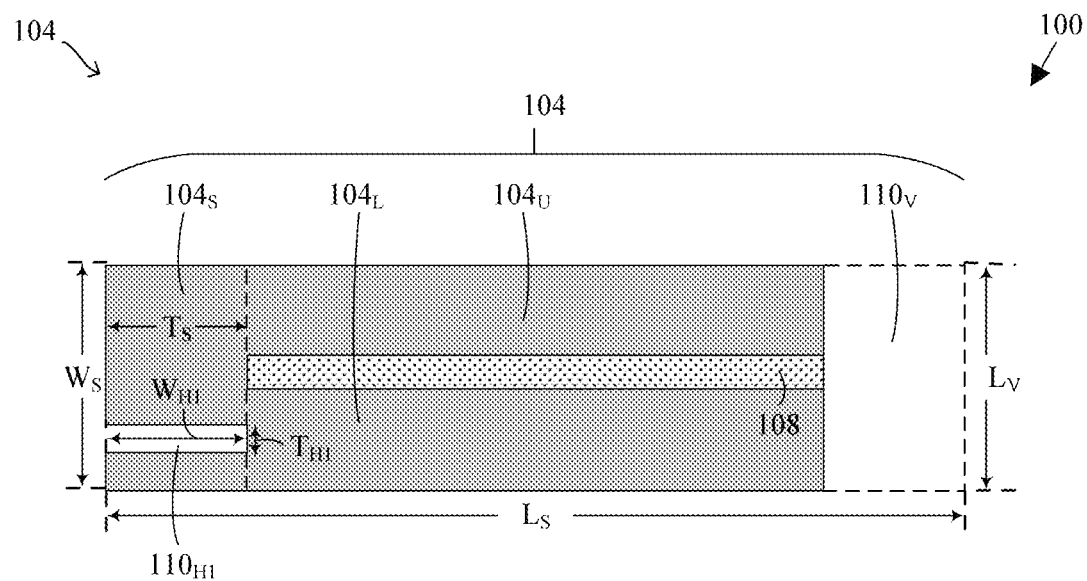
FIGS. 1C to 1D are cross-sectional views of the assembled semiconductor device in FIG. 1A, taken along a line A-A' and a line B-B, respectively, according to embodiments of the disclosure.
Figure 1D:
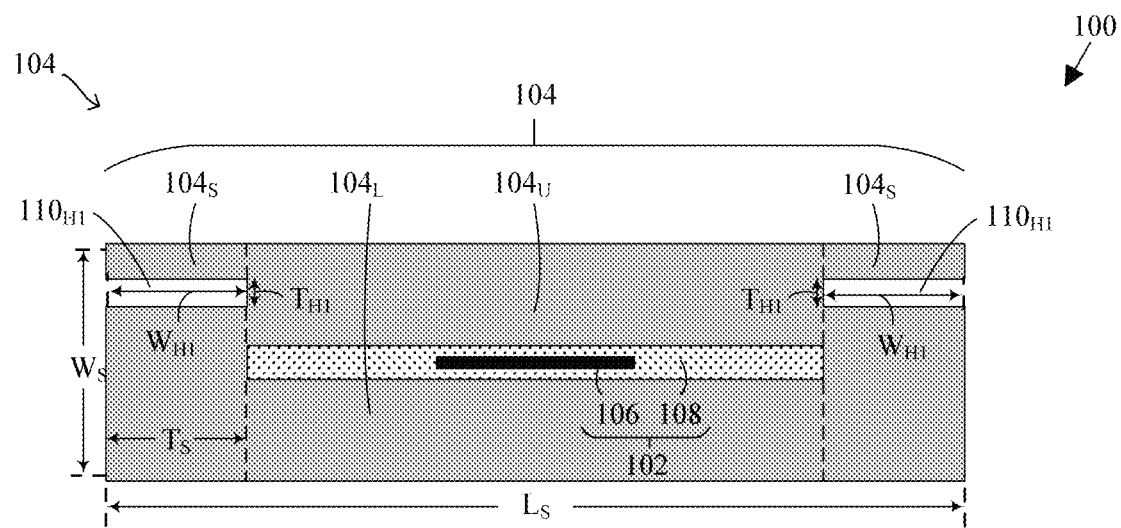

FIG. 1A illustrates a perspective view of an assembled semiconductor device 100, FIG. 1B illustrates a top view of the assembled semiconductor device 100, and FIGS. 1C to 1D illustrate cross-sectional views of the assembled semiconductor device 100 of FIG. 1A, along a line A-A' and a line B-B', respectively, according to an embodiment of the disclosure. The assembled semiconductor device 100 is illustrated in a "face-down" orientation (i.e., electrical connections to the assembled semiconductor device 100 are facing "down", although the electrical connections are not shown in FIGS. 1A to 1D).

Referring first to FIG. 1A, the assembled semiconductor device 100 may include an assembly of a packaged semiconductor device 102 in an outer enclosure 104. The packaged semiconductor device 102 may include a semiconductor chip 106 arranged within a package 108; the semiconductor chip 106 having a dashed outline. In an embodiment of the disclosure, the semiconductor chip 106 may include a magneto-resistive random-access memory (MRAM) chip.

The outer enclosure 104 may enclose the packaged semiconductor device 102 therewithin. For example, referring to FIG. 1D, the outer enclosure 104 may include a lower section $104_L$ under the packaged semiconductor device 102, an upper section $104_U$ over the packaged semiconductor device 102. Referring to FIGS. 1A and 1D, the outer enclosure 104 may further include side sections $104_S$ arranged to peripherally surround the packaged semiconductor device 102. The lower section $104_L$, the upper section $104_U$, and the side sections $104_S$ may be arranged to form an integral outer enclosure 104; the upper section $104_U$ of the outer enclosure 104 is not illustrated in FIG. 1A for clarity purposes.

In an embodiment of the disclosure, each side section $104_S$ may have an outer length $L_S$, a width $W_S$, and a thickness $T_S$. Each side section $104_S$ may have an end portion that may overlap with an end portion of an immediately adjacent side section $104_S$; overlap regions are illustrated with dash-dot-dot lines in FIG. 1B. Even though FIGS. 1A and 1B illustrate the side sections $104_S$ as being substantially identical, i.e., the outer enclosure may be a square enclosure such that each side section $104_S$ having a substantially equal outer length $L_S$, a width $W_S$, and a thickness $T_S$, the outer enclosure 104 may be configured in other arrangements, such as opposing side sections $104_S$ may have an outer length $L_S$ that is different from adjacent side sections $104_S$ that extend substantially perpendicular thereto.

The outer enclosure 104 may include a soft magnetic material having sufficiently high magnetic permeability and a sufficiently high magnetic saturation. For example, the magnetic material may include, but is not limited to, cobalt or alloy compositions thereof including cobalt zirconium tantalum, alloy compositions of zinc including cadmium zinc telluride, nickel-zinc-copper, zinc ferrite, or combinations thereof, or permalloys including nickel and iron.

The outer enclosure 104 may further include a non-magnetic region 110 arranged in each section, i.e., the upper section $104_U$, the lower section $104_L$, and the side sections $104_S$. The non-magnetic region 110 may be arranged to form a framework of the non-magnetic region that is arranged adjacent to at least four opposing sides of the packaged semiconductor device 102 and may not fully expose the semiconductor chip 106 within the package 108. In an embodiment of the disclosure, the non-magnetic region 110 may volumetrically occupy about 10% to 30% of the outer enclosure 104. In another embodiment of the disclosure, at least one of the side section $104_S$ may include a vertical non-magnetic region $110_V$ and a horizontal non-magnetic region $110_U$.

The vertical non-magnetic region $110_V$ may extend substantially perpendicular to and substantially across the length $L_S$ of the side section $104_S$ of the outer enclosure 104. For example, the vertical non-magnetic region $110_V$ may have a length $L_V$, a width $W_V$, and a thickness $T_V$, and the length $L_V$ may be substantially equal to the width $W_S$ of the side section $104_S$. The thickness $T_V$ of the vertical non-magnetic region $110_V$ may be substantially equal to the thickness $T_S$ of the side section $104_S$ of the outer enclosure 104. The width $W_V$ of the vertical non-magnetic region $110_V$ may be designed such that the semiconductor chip 106 in the package 108 may not lie in the magnetic field line of sight propagation through the vertical non-magnetic region $110_V$. For example, the semiconductor chip 106 may not intersect any planes extending from a surface of the vertical non-magnetic region $110_V$.

In an embodiment of the disclosure, the vertical non-magnetic region $110_V$ may be arranged proximate to a corner of the packaged semiconductor device 102 and may not overlap a portion of thereof, as illustrated in FIGS. 1B and 1C. In another embodiment of the disclosure, the vertical non-magnetic region $110_V$ may extend through the width $W_S$ of the side section $104_S$ of the outer enclosure 104 such that the vertical non-magnetic region $110_V$ may be arranged through the upper section $104_U$ of the outer enclosure 104, as illustrated in FIG. 1B, and the lower section $104_L$ of the outer enclosure (not shown).

The horizontal non-magnetic region $110_H$ may extend substantially parallel to and along the length $L_S$ of the side section $104_S$ of the outer enclosure 104. The horizontal non-magnetic region $110_H$ may include a first portion $110_{H1}$ and a second portion $110_{H2}$, and the vertical non-magnetic region $110_V$ may be arranged between the first portion $110_{H1}$ and the second portion $110_{H2}$ of the horizontal non-magnetic region $110_H$. In an embodiment of the disclosure, the first portion $110_{H1}$ may have a length $L_{H1}$ and the second portion $110_{H2}$ may have a length $L_{H2}$, and the length $L_{H1}$ may be longer than the length $L_{H2}$.

The first portion $110_{H1}$ may have a width $W_{H1}$ and a thickness $T_{H1}$, while the second portion $110_{H2}$ may have a width Wm and a thickness $T_{H2}$. In an embodiment, the width $W_{H1}$ and the width $W_{H2}$ may be substantially equal to the thickness $T_S$ of the side sections $104_S$ of the outer enclosure 104. In another embodiment, the widths $W_{H1}$ and width $W_{H2}$ may not be equal. In yet another embodiment of the disclosure, the thickness $T_{H1}$ may be substantially equal to the thickness $T_{H2}$. In yet another embodiment, the thicknesses $T_{H1}$ and $T_{H2}$ may not be equal.

According to an embodiment of the disclosure, the first portion $110_{H1}$ and the second portion $110_{H2}$ of the horizontal non-magnetic region $110_H$ may each have an end portion arranged in the overlap region, as illustrated with dash-dot-dot lines in FIG. 1B, of the side section $104_S$ with an immediately adjacent side section $104_S$.

The thickness $T_{H1}$, $T_{H2}$ of the horizontal non-magnetic region $110_H$ may be thinner than the width $W_S$ of the side section $104_S$. For example, the horizontal non-magnetic region $110_H$ may be arranged over or under the packaged semiconductor device 102 such that the semiconductor chip 106 in the package 108 may not lie in the magnetic field line of sight propagation through the horizontal non-magnetic region $110_H$, i.e., the semiconductor chip 106 may not intersect any planes extending from a surface of the horizontal non-magnetic region $110_H$.

In another example, as illustrated in FIGS. 1C and 1D, the semiconductor chip 106 may be vertically spaced apart from the horizontal non-magnetic region $110_H$. In an embodiment of the disclosure, the horizontal non-magnetic region $110_H$ may not underlie or overlap the packaged semiconductor device 102, as illustrated in FIGS. 1C and 1D, respectively. In another embodiment of the disclosure, the horizontal non-magnetic region $110_H$ may underlie or overlap a portion of the packaged semiconductor device 102, as long as the semiconductor chip 106 in the packaged semiconductor device 102 does not lie in the magnetic field line of sight propagation through the horizontal non-magnetic region $110_H$, even though this embodiment is not illustrated in the accompanying drawings.

The non-magnetic region 110 of the outer enclosure 104 may create regions of high magnetic reluctance. For example, the non-magnetic region 110 may be unfilled with material and may be referred to as an opening, a void filled with air, or an air gap. Air has relatively high magnetic reluctance and the opening may reduce the effects of saturation by increasing the magnetic reluctance of the outer enclosure 104. The outer enclosure 104 may then shield the packaged semiconductor device 102 therewithin from any external magnetic field, enabling the semiconductor chip 106 within the packaged semiconductor device 102 to achieve higher reliability.

In another example, the non-magnetic region 110 may be filled with a non-magnetic material. The non-magnetic material may include, but is not limited to, epoxy, polymer, or a molding compound. The non-magnetic material may further strengthen the integrity of the outer enclosure 104 to minimize potential mechanical impact to the packaged semiconductor device 102.

Figure 2A:
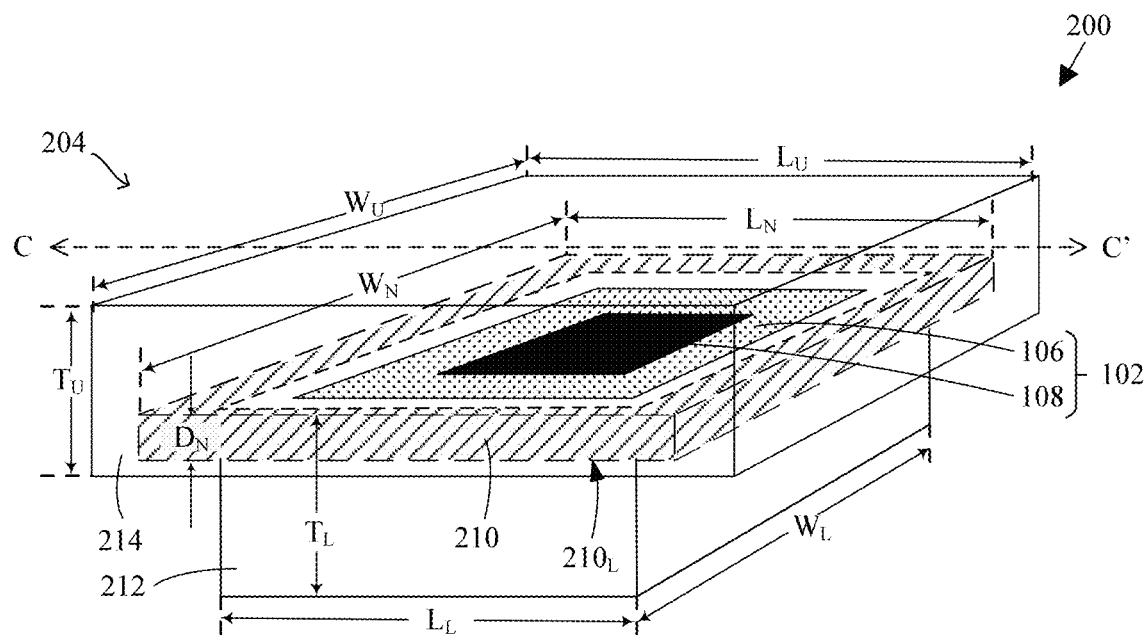
FIG. 2A is a perspective view of an assembled semiconductor device, according to another embodiment of the disclosure.
Figure 2B:
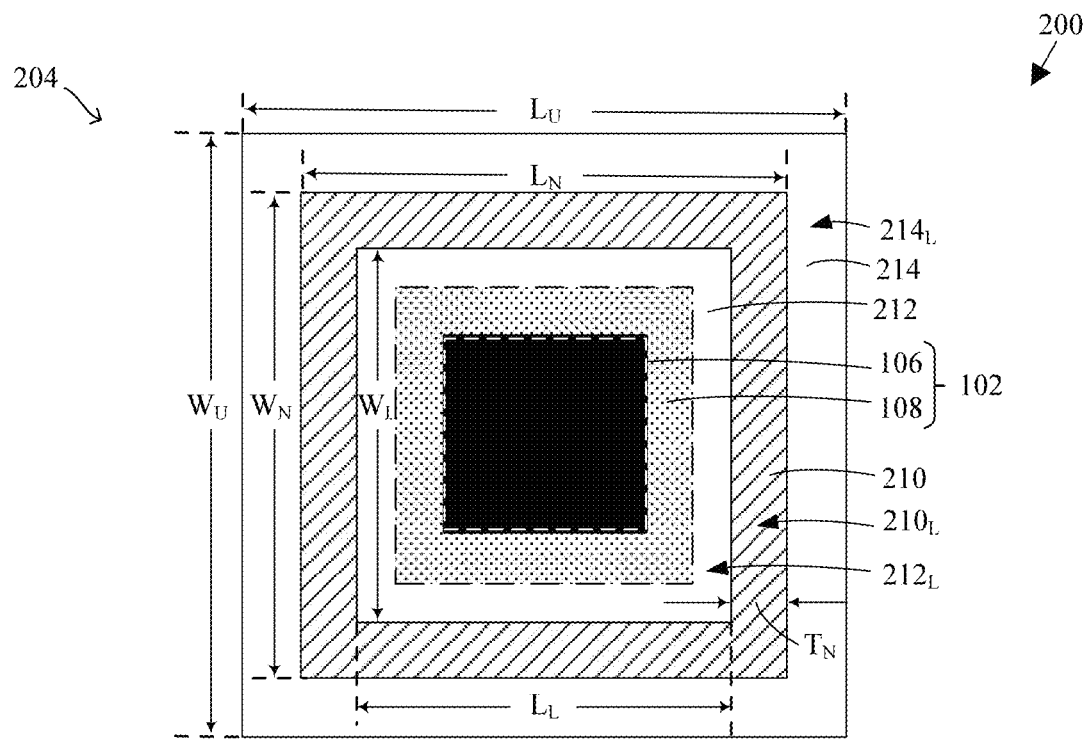
FIG. 2B is a bottom view of the assembled semiconductor device in FIG. 2A, according to an embodiment of the disclosure.
Figure 2C:
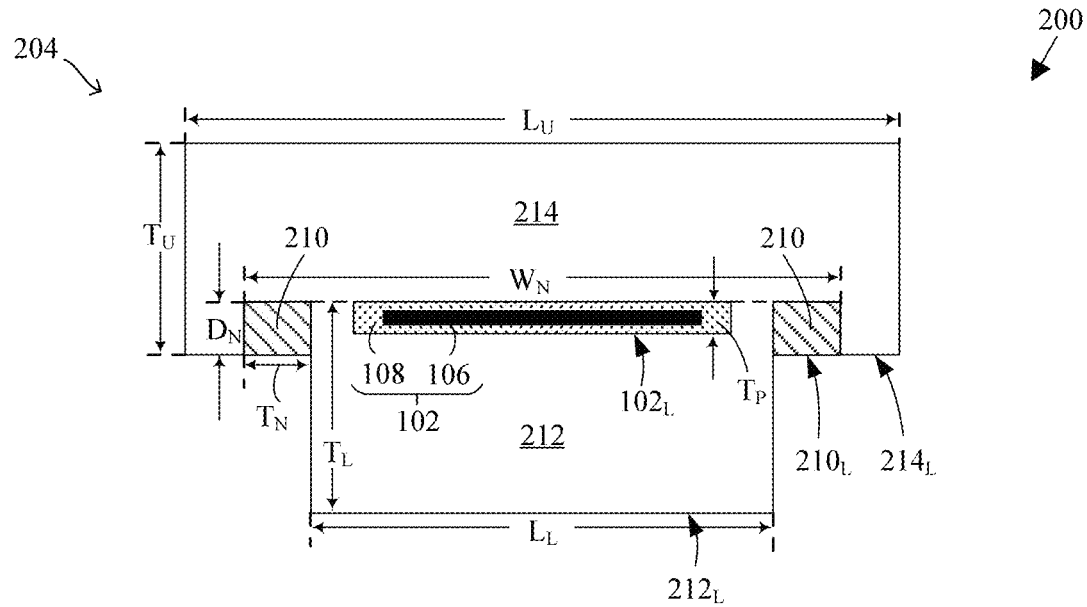
FIG. 2C is a cross-sectional view of the assembled semiconductor device in FIG. 2A, taken along a line C-C', according to embodiments of the disclosure.

FIG. 2A illustrates a perspective view of an assembled semiconductor device 200, FIG. 2B illustrates a bottom view of the assembled semiconductor device 200, and FIG. 2C illustrates a cross-sectional view of the assembled semiconductor device 200 along a line C-C' of FIG. 2A, according to an embodiment of the disclosure. The assembled semiconductor device 200 may be similar to the assembled semiconductor device 100 of FIG. 1A, and thus common features are labeled with the same reference numerals and need not be discussed. For example, the assembled semiconductor device 200 may include a packaged semiconductor device 102 having a semiconductor chip 106 arranged within a package 108.

The assembled semiconductor device 200 may further include an outer enclosure 204 enclosing the packaged semiconductor device 102. The outer enclosure 204 may also include a non-magnetic region 210 therewithin. However, unlike the outer enclosure 104 of the assembled semiconductor device 100 in FIGS. 1A to 1D, the outer enclosure 204 may include a lower section 212 and an upper section 214 arranged over the lower section 212. The lower section 212 of the outer enclosure 204 may be directly in contact with the upper section 214 of the outer enclosure 204, as illustrated in FIG. 2C; an interface between the upper section 214 and the lower section 212 is demarcated with a dash-dot line.

The lower section 212 may have a length $L_L$, a width $W_L$, and a thickness $T_L$; the length $L_L$ may not necessarily be equal to the width $W_L$. The upper section 214 may have a length $L_U$, a width $W_U$, a thickness $T_U$; the length $L_U$ may not necessarily be equal to the width $W_U$. In an embodiment of the disclosure, the upper section 214 of the outer enclosure 204 may fully extend over the lower section 212. Accordingly, the length $L_U$ and the width $W_U$ of the upper section may be wider than the length $L_L$ and the width $W_L$ of the lower section 212. In another embodiment of the disclosure, the outer enclosure 204 may acquire a T-shaped cross-sectional profile.

The outer enclosure 204 may further include a non-magnetic region 210 arranged between the lower section 212 and the upper section 214, and further arranged adjacent to at least four opposing sides of the lower section 212. The non-magnetic region 210 may be further arranged within the upper section 214 of the outer enclosure 204. The non-magnetic region 210 may have a length $L_N$, a width $W_N$, a thickness $T_N$, and a depth $D_N$ from the lower surface $214_L$ of the upper section 214 of the outer enclosure 204. The length $L_N$ and the width $W_N$ may be narrower than the length $L_U$ and the width $W_U$ of the upper section 214 of the outer enclosure 204, respectively.

In another example, the non-magnetic region 210 may have a lower surface $210_L$, and the lower surface $210_L$ may be arranged adjacent to a lower surface $214_L$ of the upper section 214 of the outer enclosure 204, as illustrated in FIG. 2B. In an embodiment of the disclosure, the lower surface $210_L$ of the non-magnetic region 210 may be substantially coplanar with the lower surface $214_L$ of the upper section 214 of the outer enclosure 204, as illustrated in FIG. 2C. However, the lower surface $210_L$ of the non-magnetic region 210 may not necessarily be substantially coplanar with the lower surface $214_L$ of the upper section 214 of the outer enclosure 204.

The lower section 212 of the outer enclosure 204 may be at least partially arranged within the non-magnetic region 210. For example, the lower section 212 of the outer enclosure 204 may be arranged adjacent to the non-magnetic region 210 such that the non-magnetic region 210 may peripherally surround at least a portion of the lower section 212, as illustrated in FIGS. 2A to 2B. The lower section 212 of the outer enclosure 204 may have a lower surface $212_L$, and the lower surface $212_L$ may not overlap the lower surfaces $214_L$ and $210_L$ of the upper section 214 and the non-magnetic region 210, respectively, as illustrated in FIGS. 2B to 2C.

The packaged semiconductor device 102 may be arranged within the lower section 212 of the outer enclosure 204. The packaged semiconductor device 102 may have a lower surface $102_L$, and the lower surface $210_L$ of the non-magnetic region 210 may be on the same plane or under the lower surface $102_L$ of the packaged semiconductor device 102. For example, as illustrated in FIG. 2C, the lower surface $210_L$ of the non-magnetic region 210 may be on the same plane as the lower surface $102_L$ of the packaged semiconductor device 102. In another example, the non-magnetic region 210 has a depth $D_N$ and the packaged semiconductor device 102 has a thickness $T_P$, and the depth $D_N$ may be greater than the thickness $T_P$ of the packaged semiconductor device 102, and the packaged semiconductor device 102 may be arranged within the confines of the non-magnetic region 210. In an embodiment of the disclosure, the depth $D_N$ of non-magnetic region 210 may be at least 0.01 mm for shielding against magnetic fields, for example, up to 5 kOe.

Similar to the outer enclosure 104 of FIGS. 1A to 1D, the outer enclosure 204 of the assembled semiconductor device 200 may include a magnetic material having sufficiently high magnetic permeability at a sufficiently high saturation magnetic field. The material may include, but is not limited to, permalloy, cobalt, or alloy compositions of zinc including cadmium zinc telluride (CZT), nickel-zinc-copper (Ni—Zn—Cu), zinc ferrite, or combinations thereof. The non-magnetic region 210 of the outer enclosure 204 may include a non-magnetic material, such as, but is not limited to, epoxy, polymer, or a molding compound.

Figure 3:
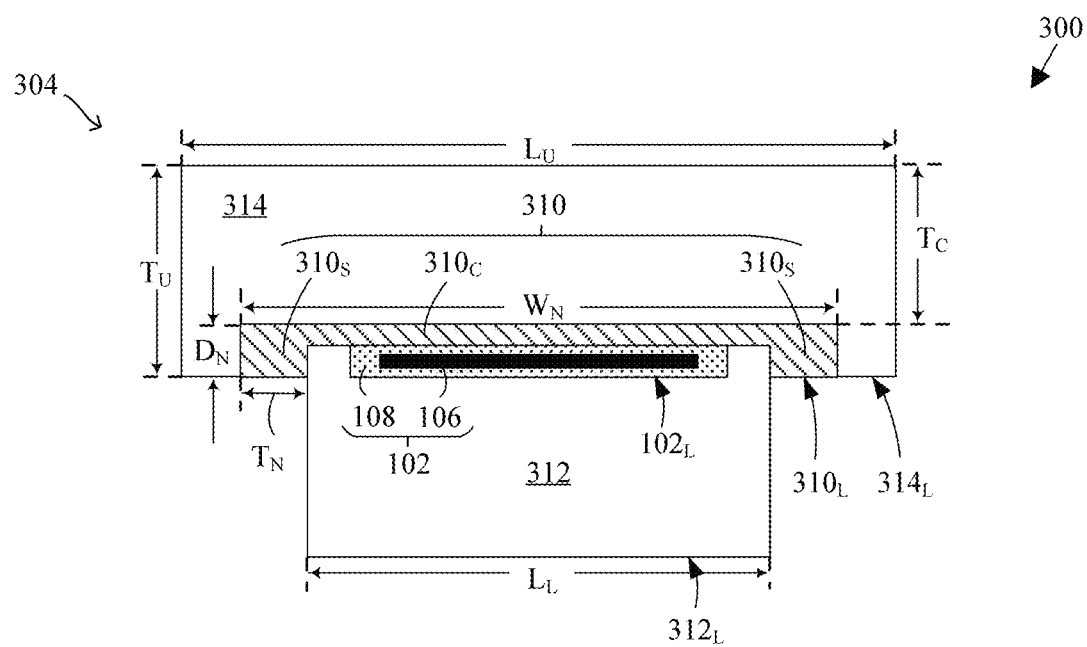
FIG. 3 is a cross-sectional view of an assembled semiconductor device, according to yet another embodiment of the disclosure.

FIG. 3 illustrates a cross-sectional view of the assembled semiconductor device 300, according to an embodiment of the disclosure. The assembled semiconductor device 300 may be similar to the assembled semiconductor device 200 of FIGS. 2A to 2C, and thus common features are labeled with the same reference numerals and need not be discussed. For example, the assembled semiconductor device 200 may include a packaged semiconductor device 102 having a semiconductor chip 106 arranged within a package 108.

The assembled semiconductor device 300 may further include an outer enclosure 304 enclosing the packaged semiconductor device 102. The outer enclosure 304 may include a lower section 312 and an upper section 314 arranged over the lower section 312. The outer enclosure 304 may also include a non-magnetic region 310 therewithin.

However, unlike the outer enclosure 204 of the assembled semiconductor device 200 in FIGS. 2A to 2C, the upper section 314 of the outer enclosure 304 may be spaced apart from the lower section 312 by the non-magnetic region 310. For example, the non-magnetic region 310 may be arranged between the upper section 314 and the lower section 312 of the outer enclosure, and may extend over the lower section 312. In another example, the non-magnetic region 310 may include side sections $310_S$ arranged adjacent to the side surfaces of the lower section 312 and a cover section $310_C$ arranged over the lower section 312. In yet another example, the upper section 314 may have a thickness $T_C$ over the cover section $310_C$ of the non-magnetic region 310, such that the thickness $T_C$ may be thinner than the thickness $T_U$ of the upper section 314.

The non-magnetic region 310 may have a lower surface $310_L$, and the lower surface $310_L$ may be arranged adjacent to a lower surface $314_L$ of the upper section 314 of the outer enclosure 304. In an embodiment of the disclosure, the lower surface $310_L$ of the non-magnetic region 310 may be substantially coplanar with the lower surface $314_L$ of the upper section 314 of the outer enclosure 304. However, the lower surface $310_L$ of the non-magnetic region 310 may not necessarily be substantially coplanar with the lower surface $314_L$ of the upper section 314 of the outer enclosure 304. In another embodiment of the disclosure, the lower surface $310_L$ of the non-magnetic region 310 may be on the same plane or under the lower surface $102_L$ of the packaged semiconductor device 102. In yet another embodiment of the disclosure, the non-magnetic region may acquire an inverted U-shaped cross-sectional profile.

As presented in the above disclosure, various embodiments of outer enclosures for magnetic shielding of semiconductor devices are presented. The semiconductor devices may include a semiconductor chip including a magnetic material, such as one that utilizes the orientation of a magnetization vector for device operation, for example, an MRAM cell or the like. In an MRAM cell, the device characteristics depend on the behavior and properties of the magnetization vector, for example, the stability of the non-volatile memory state and the repeatability of the read/write cycles.

An outer enclosure may be provided over a packaged semiconductor device to magnetically shield the packaged semiconductor device from an external magnetic field. The external magnetic field may occur from the environment, such as from the earth or power lines, or may be an intentionally introduced magnetic field, such as from a bar magnet. These sources of the external magnetic field may affect the reliability of the magnetic material in the semiconductor chip.

The outer enclosure may include a magnetic region and a non-magnetic region to provide relatively higher magnetic reluctance. For example, the non-magnetic region may include an opening (air gap or void) or a filled opening of a non-magnetic material. The non-magnetic region may reduce the effects of saturation by increasing the magnetic reluctance of the outer enclosure. The outer enclosure may then shield the packaged semiconductor device therewithin from any external magnetic field, enabling the semiconductor chip within the packaged semiconductor device to achieve higher reliability.

The terms "upper", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of ninety degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. An assembly, comprising:
a packaged semiconductor device including a semiconductor chip, the packaged semiconductor device comprising at least four opposing sides; and
an outer enclosure enclosing the packaged semiconductor device, the outer enclosure comprising a magnetic material and further comprising a non-magnetic region arranged adjacent to the at least four opposing sides of the packaged semiconductor device, wherein the outer enclosure comprises a side section, and the non-magnetic region comprises a horizontal non-magnetic region and a vertical non-magnetic region arranged through the side section of the outer enclosure, the horizontal non-magnetic region extending parallel to the side section and the vertical non-magnetic region extending perpendicular to the side section.

2. The assembly of claim 1, wherein the packaged semiconductor device further comprises a corner, and the vertical non-magnetic region of the outer enclosure is arranged proximate to the corner of the packaged semiconductor device.

3. The assembly of claim 1, wherein the non-magnetic region comprises an opening in the outer enclosure.

4. The assembly of claim 1, wherein the outer enclosure comprises a lower section and an upper section over the lower section, and the non-magnetic region is arranged between the lower section and the upper section of the outer enclosure.

5. The assembly of claim 4, wherein the lower section of the outer enclosure comprises at least four opposing sides and the non-magnetic region is arranged adjacent to the at least four opposing sides of the lower section of the outer enclosure.

6. The assembly of claim 5, wherein the non-magnetic region further extends over the lower section of the outer enclosure.

7. The assembly of claim 1, wherein the non-magnetic region comprises epoxy, polymer, or a molding compound.

8. The assembly of claim 1, wherein the magnetic material of the outer enclosure comprises cobalt, alloy compositions of cobalt, alloy compositions of zinc, or permalloys.

9. The assembly of claim 1, wherein the semiconductor chip comprises a magneto-resistive random-access memory (MRAM) chip.

10. An assembly, comprising:
a packaged semiconductor device including a semiconductor chip; and
an outer enclosure comprising a magnetic material enclosing the packaged semiconductor device, the outer enclosure comprises a side section having a horizontal non-magnetic region and a vertical non-magnetic region arranged therewithin.

11. The assembly of claim 10, wherein the horizontal non-magnetic region comprises a first portion and a second portion, and the vertical non-magnetic region is arranged between the first portion and the second portion of the horizontal non-magnetic region.

12. The assembly of claim 11, wherein the first portion of the horizontal non-magnetic region has a first length and the second portion of the horizontal non-magnetic region has a second length, and the first length is longer than the second length.

13. The assembly of claim 10, wherein the horizontal non-magnetic region extends parallel to and through the side section of the outer enclosure.

14. The assembly of claim 10, wherein the vertical non-magnetic region extends perpendicular to and through the side section of the outer enclosure.

* * * * *